(12) United States Patent
Adachi

(10) Patent No.: US 9,559,153 B2
(45) Date of Patent: Jan. 31, 2017

(54) DISPLAY DEVICE

(71) Applicant: Japan Display Inc., Tokyo (JP)

(72) Inventor: Masaya Adachi, Tokyo (JP)

(73) Assignee: Japan Display Inc., Tokyo (JP)

( * ) Notice: Subject to any disclaimer, the term of this patent is extended or adjusted under 35 U.S.C. 154(b) by 26 days.

(21) Appl. No.: 14/605,140

(22) Filed: Jan. 26, 2015

(65) Prior Publication Data

US 2015/0214282 A1    Jul. 30, 2015

(30) Foreign Application Priority Data

Jan. 27, 2014   (JP) ................................ 2014-012820

(51) Int. Cl.
*H01L 27/32* (2006.01)
*H01L 51/52* (2006.01)
*H01L 27/115* (2006.01)

(52) U.S. Cl.
CPC ..... *H01L 27/3244* (2013.01); *H01L 27/11582* (2013.01); *H01L 51/5218* (2013.01); *H01L 51/5281* (2013.01); *H01L 27/3213* (2013.01); *H01L 51/5234* (2013.01); *H01L 51/5262* (2013.01)

(58) Field of Classification Search
CPC ............ H01L 27/11582; H01L 51/5218; H01L 27/3244; H01L 51/5262
See application file for complete search history.

(56) References Cited

U.S. PATENT DOCUMENTS

| 4,100,459 | A | * | 7/1978 | Nakamura | G03B 15/05 315/134 |
| 6,278,503 | B1 | * | 8/2001 | Nishikawa | G02F 1/136213 349/123 |
| 7,122,835 | B1 | * | 10/2006 | Ikeda | G02F 1/13454 257/59 |
| 2006/0232199 | A1 | * | 10/2006 | Takahashi | H01L 51/5234 313/504 |
| 2006/0286698 | A1 | * | 12/2006 | Kurashina | G02F 1/136213 438/29 |
| 2009/0108743 | A1 | | 4/2009 | Kobayashi | |

(Continued)

FOREIGN PATENT DOCUMENTS

JP    2009-135081 A    6/2009
KR    2008047782 A  *  5/2008

*Primary Examiner* — Thao X Le
*Assistant Examiner* — Xia L Cross
(74) *Attorney, Agent, or Firm* — Typha IP LLC

(57) ABSTRACT

A display device includes: an organic layer arranged in plural pixels which are arranged in a display area in a matrix; a first electrode that is formed on a surface of the organic layer opposite to a substrate, and transmits a visible light; a second electrode that holds the organic layer in cooperation with the first electrode, and is lower in the transmittance of the visible light, and higher in the reflectance than the first electrode; an insulating layer that holds the second electrode in cooperation with the organic layer, and higher in the transmittance of the visible light, and lower in the reflectance than the second electrode; and a third electrode that holds the insulating layer in cooperation with the second electrode, is formed across adjacent pixels of the plural pixels, and lower in the transmittance of the visible light, and higher in the reflectance than the second electrode.

18 Claims, 12 Drawing Sheets

(56) References Cited

U.S. PATENT DOCUMENTS

| | | | | |
|---|---|---|---|---|
| 2010/0090205 A1* | 4/2010 | Ofuji | ............... | H01L 27/3265 257/40 |
| 2011/0007049 A1* | 1/2011 | Kikuchi | ............... | G09G 3/3677 345/208 |
| 2011/0092017 A1* | 4/2011 | Akimoto | ............... | H01L 27/1225 438/104 |
| 2011/0229994 A1* | 9/2011 | Jung | ............... | H01L 27/3211 438/29 |
| 2012/0098412 A1* | 4/2012 | Shin | ............... | H01L 51/5036 313/498 |
| 2012/0228590 A1* | 9/2012 | Matsumi | ............... | H01L 51/5209 257/40 |
| 2012/0307172 A1* | 12/2012 | Yoshida | ............... | G02F 1/133707 349/43 |
| 2014/0159012 A1* | 6/2014 | Song | ............... | H01L 27/3276 257/40 |

\* cited by examiner

FIG.11

|  | FIRST EMBODIMENT | SECOND EMBODIMENT |
|---|---|---|
| BRIGHTNESS(W) | 5%up | 8%up |
| BRIGHTNESS(B) | 85%up | 58%up |
| BRIGHTNESS(G) | 2%up | 4%up |
| BRIGHTNESS(R) | 0% | 3%up |

DISPLAY DEVICE

CROSS-REFERENCE TO RELATED APPLICATION

The present application claims priority from Japanese application JP2014-012820 filed on Jan. 27, 2014, the entire contents of which are hereby incorporated by reference into this application.

BACKGROUND OF THE INVENTION

1. Field of the Invention

The present invention relates to a display device.

2. Description of the Related Art

In recent years, image display devices (hereinafter referred to as "organic EL (electroluminescent) display devices") using self-luminous bodies called "organic light emitting diodes (OLED)" have been put into practical use. As compared with a conventional liquid crystal display device, because the organic EL display device uses the self-luminous bodies, the organic EL display device is not only excellent in visibility and response speed, but also does not require an auxiliary lighting device such as a backlight. As a result, the organic EL display device can be further thinned.

In the organic EL display device, in order to efficiently emit a light from the organic light emitting diode to the outside, an electrode arranged on a back side as seen from a display surface side of electrodes for supplying a current to an organic layer may be made of a material high in reflectivity. In this case, the electrode also reflects an external light to deteriorate a contrast ratio, and therefore a circular polarizing plate may be disposed on the display surface side to reduce the reflection of external light.

JP 2009-135081 A discloses the invention for obtaining a reduction effect in the external light reflection due to a laminated body of a semi-reflective layer, a transparent layer, and a reflective layer in addition to a reduction effect of external light reflected by a color filter.

SUMMARY OF THE INVENTION

However, when the circular polarizing plate is provided as described above, the advantage of the organic EL display device that can be thinned is sacrificed more than a little, and not only the external light but also the light from the organic light emitting diode would be uniformly reduced regardless of a wavelength.

Also, when a new layer is laminated for each of pixels as illustrated in JP 2009-135081 A, the effect of reducing the reflected light cannot be sufficiently obtained unless openings are formed in only areas where the layers newly added overlap with each other, as a result of which it is desirable to narrowly design the openings taking a position deviation of the respective layers into account. However, if the openings are narrowed, a light emission efficiency of the organic EL display device may be lowered.

Under the circumstances, the present invention aims to provide a display device that reduces the reflection of external light while suppressing the reduction in the light emission efficiency.

According to the present invention, there is provided an organic EL display device, including: a substrate; a plurality of pixels that is arranged in a display area in a matrix, and includes an organic layer having at least a light emission layer, and a light emitting area; a first electrode that is formed on an opposite side of the organic layer to the substrate, and transmits a visible light; a second electrode that holds the organic layer in cooperation with the first electrode, and is lower in the transmittance of the visible light, and higher in the reflectance than the first electrode; an insulating layer that holds the second electrode in cooperation with the organic layer, and higher in the transmittance of the visible light, and lower in the reflectance than the second electrode; and a third electrode that holds the insulating layer in cooperation with the second electrode, is formed across adjacent pixels of the plurality of pixels, and lower in the transmittance of the visible light, and higher in the reflectance than the second electrode. The first electrode and the organic layer may be formed across some of the plural pixels.

Also, in the display device according to the present invention, the third electrode may be formed to be wider than the light emitting area when the light emitting area that is an area in which the organic layer comes in contact with the second electrode is viewed in a plan view from the first electrode side.

Also, in the display device according to the present invention, the third electrode may be electrically connected to the first electrode.

Also, in the display device according to the present invention, the adjacent pixels may be arranged in strips, the third electrode may be formed to extend from the display area to an outside of the display area, and electrically connected to the first electrode outside of the display area.

Also, in the display device according to the present invention, a reflectance of the light input from the first electrode side in the light emitting area may be smaller than the reflectance in the third electrode.

Also, in the display device according to the present invention, a light having a wavelength band of 540 nm to 570 nm may be smaller than a light having a wavelength band of 455 nm to 490 nm in a reflectance of the light input from the first electrode side in the pixel.

Also, in the display device according to the present invention, a reflectance of a light having a wavelength band of 430 nm to 730 nm input from the first electrode side in the pixel may be minimal in a light included in a wavelength band of 540 nm to 570 nm.

Also, in the display device according to the present invention, the second electrode may include a layer made of a metal material, and a layer made of a conductive material higher in the transmittance of the visible light than the metal material, the insulating layer may be formed to be thicker than the second electrode, and thinner than the third electrode, and the third electrode may be formed by laminating a plurality of metals.

Also, in the display device according to the present invention, the second electrode may include a metal 5 nm to 30 nm in thickness, and the third electrode may have a thickness of 100 nm to 500 nm.

Also, in the display device according to the present invention, the second electrode may include at least any one of magnesium, aluminum, titanium, chromium, iron, copper, molybdenum, tungsten, silver, and gold.

Also, in the display device according to the present invention, the second electrode may be formed by laminating indium tin oxide on molybdenum, and the insulating layer may be made of silicon nitride, and the third electrode may be formed by laminating molybdenum on aluminum.

Also, in the display device according to the present invention, the second electrode may be formed by laminating indium tin oxide 45 nm to 55 nm in thickness on molybdenum 7 nm to 9 nm in thickness, the insulating layer may be made of silicon nitride 72 nm to 88 nm in thickness, and the third electrode may be formed by laminating molybdenum 90 nm to 110 nm in thickness on aluminum 180 nm to 220 nm in thickness.

Also, in the display device according to the present invention, the second electrode may further include indium tin oxide held between the insulating layer and molybdenum.

Also, in the display device according to the present invention, the second electrode may be formed by laminating molybdenum 7 nm to 9 nm in thickness and indium tin oxide 45 nm to 55 nm in thickness on indium tin oxide 9 nm to 11 nm in thickness, the insulating layer may be made of silicon nitride 180 nm to 220 nm in thickness, and the third electrode may be formed by laminating molybdenum 9 nm to 11 nm in thickness on aluminum 180 nm to 220 nm in thickness.

BRIEF DESCRIPTION OF THE DRAWINGS

FIG. 11 is a table showing a difference of brightness between cases of the first and second embodiments of the present invention, and a case in which a circularly polarizing plate is arranged.

DETAILED DESCRIPTION OF THE INVENTION

Figure 1:
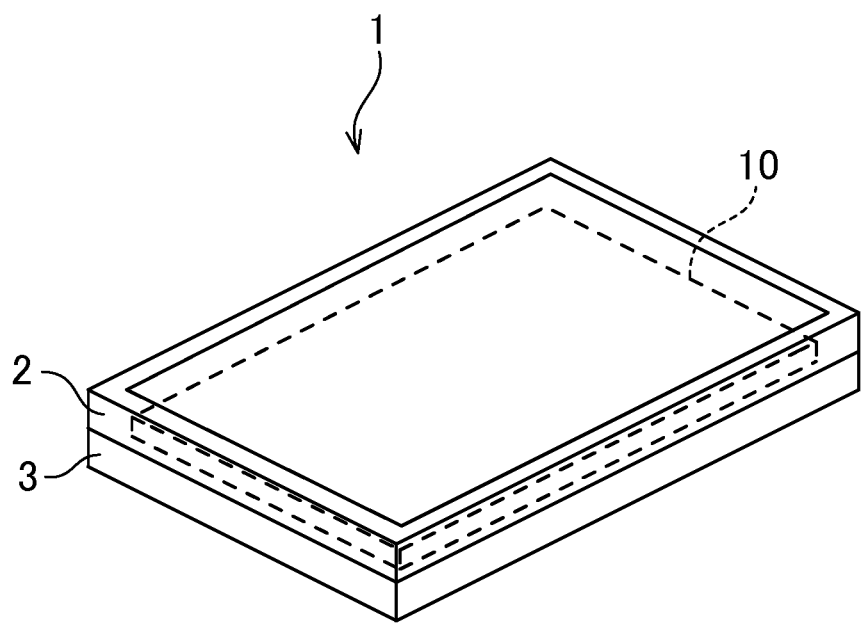
FIG. 1 is a schematic diagram illustrating an organic EL display device according to a first embodiment of the present invention.

Hereinafter, the respective embodiments of the present invention will be described with reference to the accompanying drawings. The disclosure is merely exemplary, and appropriate changes that could be easily conceived by those skilled in the art without departing from the spirit of the present invention are naturally included within the scope of the present invention. Also, in the drawings, for more clarification of the illustration, as compared with actual embodiments, widths, thicknesses, and shapes of respective parts may be schematically illustrated, but may be merely exemplary, and do not limit the interpretation of the present invention. Also, in the present specification, and the respective drawings, the same elements as those described in the foregoing drawings are denoted by identical symbols, and their detailed description will be appropriately omitted.

First Embodiment

FIG. 1 is a schematic diagram illustrating an organic EL display device 1 according to a first embodiment of the present invention. The organic EL display device 1 includes an upper frame 2, a lower frame 3, and an organic EL panel 10 fixedly held between the upper frame 2 and the lower frame 3. As occasion demands, the organic EL display device may be configured by an organic EL panel alone without the provision of the upper frame 2 and the lower frame 3.

Figure 2:
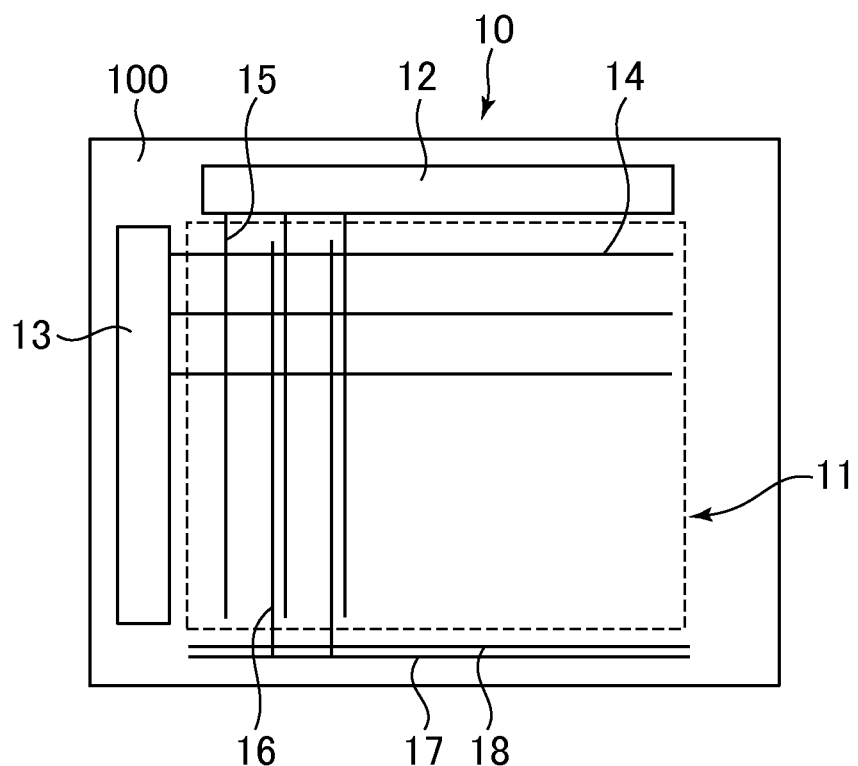
FIG. 2 is a schematic wiring diagram illustrating the organic EL display device according to the first embodiment of the present invention.

FIG. 2 is a wiring diagram illustrating the organic EL display device 1 according to the first embodiment of the present invention. The organic EL panel 10 controls respective pixels formed in a display area 11 on a panel substrate 100, and displays an image, by a data drive circuit 12 and a scanning drive circuit 13. In this example, the data drive circuit 12 is an IC (integrated circuit) that generates and transmits a data signals to be transmitted to each of the pixels, and the scanning drive circuit 13 is an IC that generates and transmits a gate signal to a TFT (thin film transistor) provided in each of the pixels. In the drawing, the data drive circuit 12 and the scanning drive circuit 13 are formed in two places, but may be incorporated into one IC, or formed by a circuit wired directly on the substrate.

Figure 3:
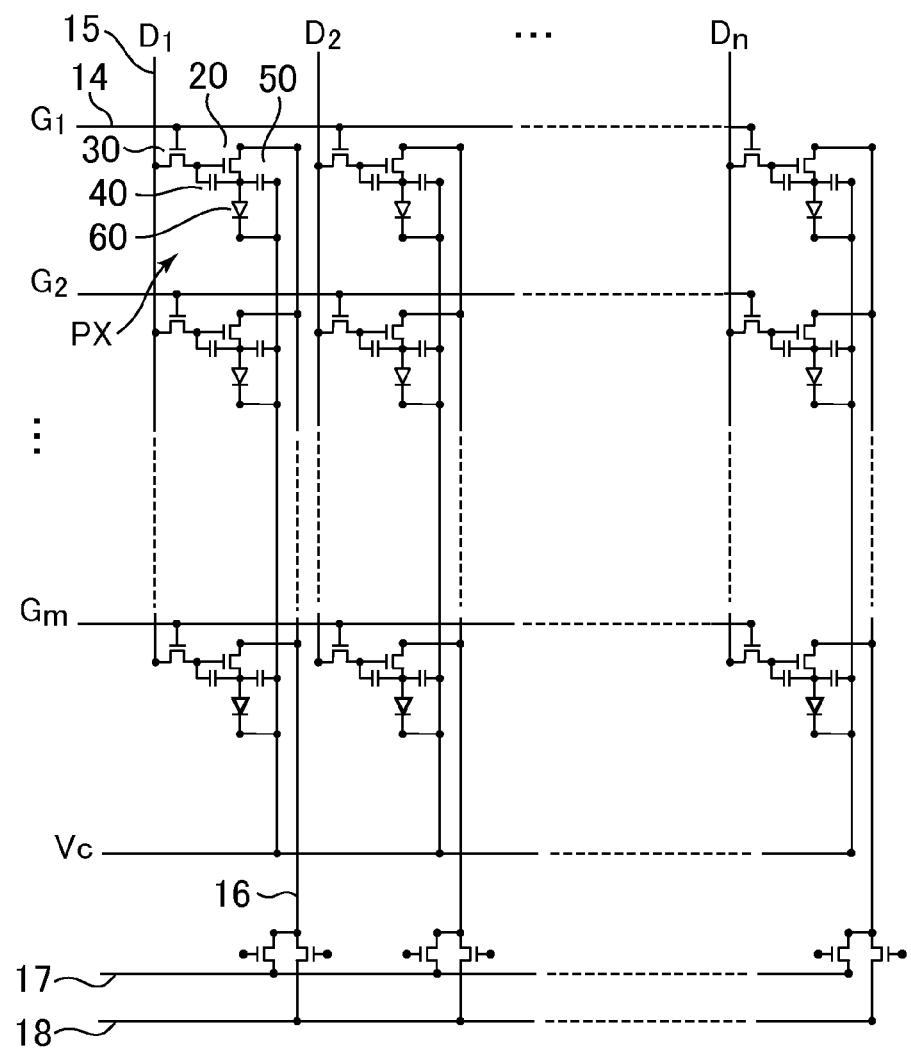
FIG. 3 is a circuit diagram illustrating the organic EL display device according to the first embodiment of the present invention.

Each of scanning lines 14 for transmitting signals from the scanning drive circuit 13 is connected to gate electrodes of switching transistors 30 illustrated in FIG. 3. Also, each of data lines 15 for transmitting signals from the data drive circuit 12 is connected to sources or drain electrodes of the switching transistors 30. Each of electric potential lines 16 is applied with a reference electric potential for allowing organic light emitting diodes 60 to emit light, and connected to source or drain electrodes of driver transistors 20. A first electric potential supply line 17 and a second electric potential supply line 18 are connected to electric potential supply sources, and connected to the electric potential lines 16 through respective transistors.

FIG. 3 is a circuit diagram illustrating the organic EL display device 1 according to the first embodiment of the present invention. n data lines 15 of D1 to Dn are formed, and m scanning lines 14 of G1 to Gm are formed in the display area 11 of the organic EL panel 10. Plural pixels PX are arranged in a matrix in a direction of extending the scanning lines 14, and a direction of extending the data lines 15. For example, one pixel PX is formed in a portion surrounded by G1 and G2, and D1 and D2.

The first scanning line G1 is connected to the gate electrode of each switching transistor 30, and when a signal is supplied from the scanning drive circuit 13, the switching transistor 30 turns on. Under the circumstances, when a signal is supplied to the first data line D1 from the data drive circuit 12, electric charge is stored in each storage capacitor 40, a voltage is applied to the gate electrode of each driver transistor 20, and the driver transistor 20 turns on. In this situation, even if each switching transistor 30 is in an off state, the driver transistor 20 becomes in an on state for a given period due to the electric charge stored in the storage capacitor 40. An anode of each organic light emitting diode 60 is connected to the electric potential line 16 through the source or drain of the driver transistor 20, and a cathode of each organic light emitting diode 60 is fixed to a reference electric potential Vc. Therefore, electric current flows into the organic light emitting diodes 60 according to the gate voltage of the driver transistor 20, and the organic light emitting diodes 60 emit light. Also, each additional capacitor 50 is formed between the anode and the cathode of the organic light emitting diode 60. The additional capacitor 50 exerts an effect of stabilizing a voltage written in the storage capacitor 40, and contributes to the operation of stabilizing the organic light emitting diode 60. Specifically, the capacitance of the additional capacitor 50 is set to be larger than the capacitance of the storage capacitor 40, to thereby exert the above effect.

Figure 4:
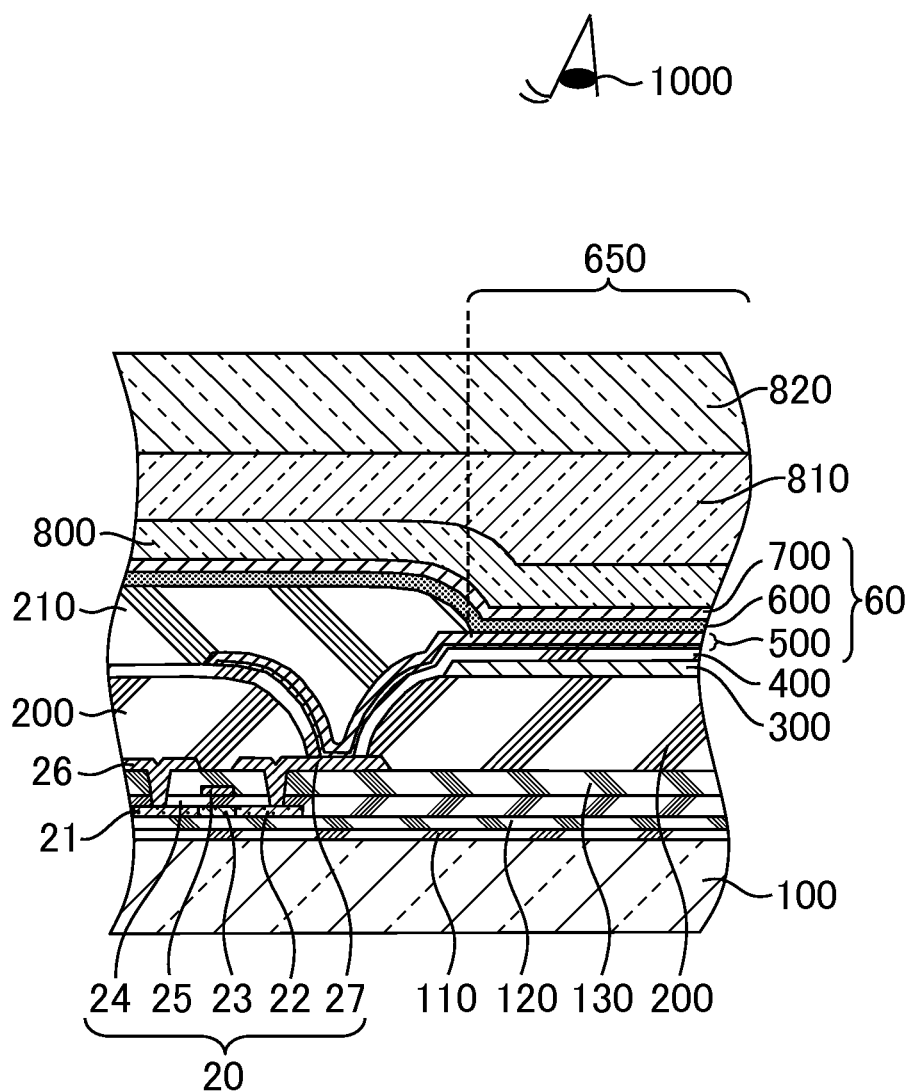
FIG. 4 is a cross-sectional view of a pixel in the organic EL display device according to the first embodiment of the present invention.

FIG. 4 is a cross-sectional view of the pixel PX in the organic EL display device 1 according to the first embodiment of the present invention. FIG. 4 specifically illustrates a connection state of the driver transistor 20 and the organic light emitting diode 60. The panel substrate 100 made of glass is arranged in the lowest layer, a first base film 110 made of SiNx is formed on the panel substrate 100, and a second base film 120 made of SiOx is formed on the first base film 110. A drain electrode layer 21, a source electrode layer 22, and a channel layer 23 are formed on the second base film 120. After a gate insulating film 24 has been formed to cover the drain electrode layer 21, the source electrode layer 22, the channel layer 23, and the second base film 120, a gate electrode layer 25 is formed above the channel layer 23. In this embodiment, layers such as the drain electrode layer 21, the source electrode layer 22, and the channel layer 23 are made of polycrystal silicon. The channel layer 23 may be made of amorphous silicon.

A first interlayer insulating film 130 is laminated to cover the gate electrode layer 25 and the gate insulating film 24, and through-holes are formed to reach the drain electrode layer 21 and the source electrode layer 22. A drain electrode 26 and a source electrode 27 are formed in the respective through-holes, and a second interlayer insulating film 200 is laminated to cover the drain electrode 26, the source electrode 27, and the first interlayer insulating film 130. A third electrode 300 is formed on the second interlayer insulating film 200, and a through-hole is formed to reach the source electrode 27. As will be described later, the third electrode 300 is formed across adjacent pixels. Thereafter, an insulating layer 400 is formed to cover the second interlayer insulating film 200 and the third electrode 300 where the through-hole is formed. A through-hole is formed to reach the source electrode 27, and a second electrode 500 is formed to be electrically connected to the source electrode 27 on a bottom of the through-hole.

In this example, the insulating layer 400 is made of a transparent inorganic material such as SiN or SiOx, or a transparent organic material such as acrylic resin or polyimide resin. Also, the second electrode 500 is made of a metal material such as Mg, Al, Ti, Cr, Fe, Cu, Mo, W, Ag, or Au, which is several nm to several tens of nm in thickness, or an alloy material of those elements. More preferably, the second electrode 500 is formed in thickness of 5 to 30 nm. The second electrode 500 is formed of a semi-permeable film that transmits a part of the visible light, and reflects the remaining part. The metal thin film of this type is not formed into a layer having a substantially equal thickness, but may have an island-like structure in which the thickness is different in the film formation area. Even if the metal thin film becomes island, in a situation where metal is scattered at intervals shorter than a visible light wavelength, and the metal thin film can be regarded as being homogeneous in the visible light level, the same function as that of the layer can be performed.

When the second electrode 500 is formed of only a metal thin film, since an electric resistance may become higher, it is desirable that the second electrode 500 is formed with a laminated structure of the metal electrode and the transparent electrode. Also, if the second electrode 500 is an anode, it is desirable that the second electrode 500 is formed with a laminated structure of the transparent electrode made of ITO (indium tin oxide), and the metal electrode from the viewpoint of a work function. The transparent electrode configuring the second electrode 500 can be made of ITO as well as IZO (indium zinc oxide), ZnO (zinc oxide), or a layer in which graphene or Ag wire is dispersed. An organic layer 600 is formed on an upper layer of the second electrode 500. The organic layer 600 may be formed on the respective pixels PX. Also, the organic layer 600 may be formed across some of the pixels PX, or over all of the pixels PX arranged in a matrix. The metal electrode and the transparent electrode configuring the second electrode 500 is of a structure in which the transparent electrode and the metal electrode are laminated from the organic layer 600 side in the stated order, or a structure in which the metal electrode is sandwiched between the transparent electrodes from above and below. In this embodiment, the former is applied. In any case, it is desirable that a thickness of the transparent electrode on the organic layer 600 side is set to be thicker than a thickness of the metal electrode. Because the transparent electrode is generally higher in electric resistance than the metal electrode, it is desirable that the thickness of the transparent electrode is set to be thicker than that of the metal electrode for the purpose of improving a situation in which the electric resistance increases due to thinning of the metal electrode.

When an optical path length between the third electrode 300 and a metal electrode layer of the second electrode 500 becomes longer, an optical path difference caused by a difference in observation angle becomes larger, and a change in the optical characteristic by the angle becomes larger. For that reason, it is desirable that the transparent electrode configuring the second electrode 500 is disposed on the organic layer 600 side opposite to the third electrode, the optical path length between the metal electrode layer of the second electrode 500, and the third electrode 300 is prevented from becoming longer, and a change in the optical characteristic caused by the angle is suppressed.

The third electrode 300 is made of a conductive material that reflects the visible light. For example, the third electrode 300 can be made of a metal material such as Al, Ti, Cr, Mo, or W, or an alloy material of those materials. It is desirable that a thickness of the third electrode 300 is 100 nm to 500 nm. This is because if the thickness of the third electrode 300 is thinner than 100 nm, the reflectance may be lowered. Also, the electric resistance is lower as the electrode is thicker. However, even if the thickness of the third electrode 300 is set to be equal to or larger than 500 nm, a reduction in the electric resistance becomes gentle, and manufacturing costs just increase, and therefore it is not desirable that the thickness of the third electrode 300 is set to be equal to or larger than 500 nm.

A pixel separation film 210 made of an insulating material is formed on the second electrode 500, and the organic layer 600 is formed on the pixel separation film. 210 and the second electrode 500. In this example, an area in which the second electrode 500 comes in contact with the organic layer 600 is a light emitting area 650, and the pixel separation film 210 defines an outer edge of the light emitting area 650. A first electrode 700 is formed on the organic layer 600. The first electrode 700 may be formed across some of the pixels PX, or all of the pixels PX arranged in a matrix. The third electrode 300 is formed to be wider than the light emitting area 650 when viewed from an observer 1000 side. In other words, when the pixels PX are viewed in a plan view from the first electrode 700 side, the third electrode 300 is formed to be wider than the light emitting area 650.

The organic layer 600 is formed by laminating a hole transport layer, a light emitting layer, and an electron transport layer from the second electrode 500 side in the stated order. The organic layer 600 may be made of a material that can serve as the light emitting layer and the electron transport layer. Also, an anode buffer layer or a hole injection layer may be arranged between the second electrode 500 and the hole transport layer. As occasion demands, a layer made of an inorganic material may be included therebetween.

The first electrode 700 is formed on the organic layer 600. The first electrode 700 is formed of a transparent electrode made of ITO or IZO. When a DC voltage is applied between the first electrode 700 and the second electrode 500, holes are implanted into the hole transport layer of the organic layer 600 from the second electrode 500 side which is an anode. Also, electrons are implanted into the electron transport layer of the organic layer 600 from the first electrode 700 side which is a cathode. The implanted electrons and holes arrive at the light emitting layer of the organic layer 600, and recombined together to generate light having a given wavelength. A part of the light generated in the light emitting layer is discharged to the first electrode 700 side, and visually recognized by the observer 1000. Also, a part of the light generated in the light emitting layer, which is emitted to the second electrode 500 side, is partially reflected by the second electrode 500 and travels toward the first electrode 700 side, and the remaining light is reflected by the third electrode 300, and transmitted to the first electrode 700 side. In this situation, the respective reflected lights interfere with each other. The same is applied to an external light input from the first electrode 700 side. The light input from the first electrode 700 side is partially reflected by the second electrode 500, and the remaining light is reflected by the third electrode 300, and the respective reflected lights interfere with each other. In this case, it is desirable that the interference occurs so that the reflectance of the pixel PX to the external light input from the first electrode 700 side is smaller than the reflectance of the third electrode 300.

There are employed the material and the structure of the organic layer 600 so that a given voltage is applied between the second electrode 500 and the first electrode 700 to allow a current to flow therebetween to obtain white light emission. In the organic EL display device 1 according to this embodiment, the organic light emitting diodes 60 in the respective pixels emit light with white, and the combination of the white light with color filters corresponding to three primary colors realizes a full color display. That is, the organic light emitting diodes 60 of the white color emission are arranged in a matrix in the given order, and if a red display pixel is present on a light extraction side, a color filter that transmits the light of red (R) is provided. If a green display pixel is present, a color filter that transmits the light of green (G) is provided. If a blue display pixel is present, a color filter that transmits the light of blue (B) is provided. As a method of forming the organic layer 600 that emits the light with white, there are a method of laminating plural light emitting layers different in the light emission color with a structure which is called "multiphoton", and a method of doping pigments different in the light emission color in one light emitting layer. In any cases, it is desirable that the organic light emitting diode 60 of the white light emission is high in the light emission efficiency, and long in the lifetime.

A sealing layer 800 transparent to the visible light is formed on the first electrode 700 as occasion demands. The sealing layer 800 is configured to prevent moisture or air from entering the organic layer 600, and desirable to be high in gas barrier property. Specifically, the sealing layer 800 may be made of a dense inorganic material such as SiN, or a laminated film of an inorganic material and an organic material. Further, a sealing member 820 transparent to the visible light is arranged above the sealing layer 800, and hermetically sealed with a sealant on a frame portion of the organic EL panel 10. It is desirable that the sealing member 820 is also high in the gas barrier property. Specifically, the sealing member 820 can be formed of a glass substrate, or a plastic substrate subjected to processing for enhancing the gas barrier property. A filler 810 made of a resin material or an inert gas such as nitrogen is encapsulated in a gap between the sealing member 820 and the sealing layer 800. The filler 810 may be made of a transparent material unlikely to emit moisture leading to the deterioration of the organic layer 600.

In this embodiment, the third electrode 300 is electrically connected to the first electrode 700, and the additional capacitor 50 is formed with the insulating layer 400 held between the third electrode 300 and the second electrode 500. Although shown later, it is desirable that an electric connection between the third electrode 300 and the first electrode 700 is performed with the provision of a through-hole outside of the display area 11.

The second electrode 500 is set to be lower in the transmittance of the visible light, and higher in the reflectance than the first electrode 700, and the insulating layer 400 is set to be higher in the transmittance of the visible light, and lower in the reflectance than the second electrode 500. The third electrode 300 is set to be lower in the transmittance of the visible light, and higher in the reflectance than the second electrode 500. With the above configuration, the reflectance of the light input from the external (observer 1000 side) is lowered. A principle that can reduce the reflectance will be described below. It is assumed that the light input to the second electrode 500, which is reflected by the second electrode 500 is a light A, and the light that penetrates through the second electrode 500, passes through the insulating layer 400, and thereafter is reflected by the third electrode 300, again travels toward the second electrode 500, and penetrates through the second electrode 500 is a light B. If the light A and the light B are equal in amplitude to each other, and shifted in phase from each other by about it, the light A and the light B cancel each other. As a result, the intensity of the reflected light can be reduced, and the reflectance of the pixels can be reduced. An area in which the effect of reducing the reflected light can be exerted is an area in which the light emitting area 650 overlaps with the third electrode 300 when viewed from the observer 1000 side. For that reason, it is desirable that the third electrode 300 is formed to be wider than the light emitting area 650 when viewed from the observer 1000 side.

Figure 5:
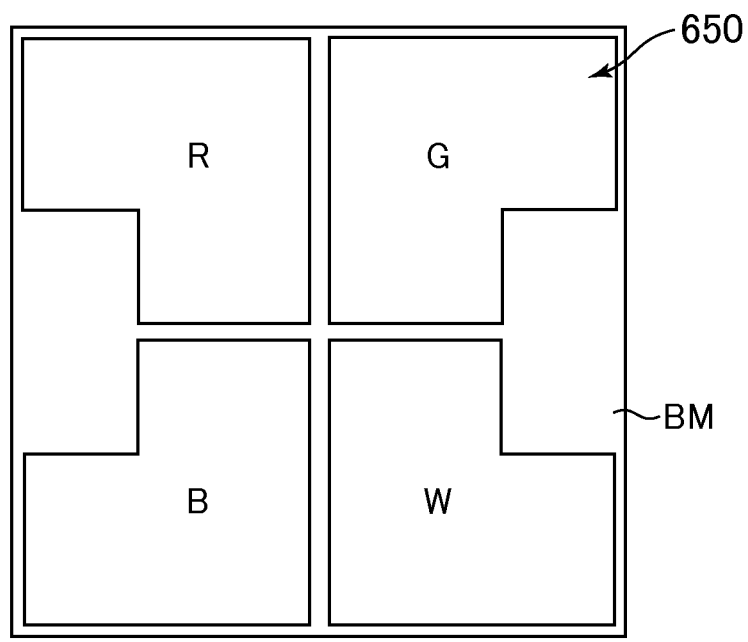
FIG. 5 is a plan view of the pixel in the organic EL display device according to the first embodiment of the present invention.

FIG. 5 is a plan view of the pixel in the organic EL display device 1 according to the first embodiment of the present invention. FIG. 5 is a plan view of a surface of the sealing member 820 in the viewpoint of the observer 1000. A surface of the sealing member 820 on the organic layer 600 side is formed with a color filter of red (R), a color filter of green (G), and a color filter of blue (B). In this embodiment, in order to reduce the power consumption of the organic EL display device 1, the organic EL display device 1 having RGB as well as white (W) display pixels will be described. However, the present invention is not limited to this configuration. No color filter may be provided for the white display pixels, but in order to adjust the chromaticity of white, the color filter may be arranged as occasion demands. The color filters are colored by a known technique such as a staining method, a pigment dispersion method, or a printing method. Also, a black matrix BM made of material containing a light absorbing material such as titanium or carbon black is formed between the respective pixels. It is desirable that the black matrix BM is formed to cover all of the area other than the light emitting area 650. This is because an area in which the suppression of the reflected light due to the third electrode 300 is not conducted is not exposed.

In this embodiment, even if a width of the black matrix BM is narrowed, if an area in which the light emitting area 650 overlaps with the third electrode 300 is widened, the function of suppressing the external light reflection can be maintained. If the width of the black matrix BM can be narrowed, because the light emitted from the light emitting layer, which is blocked and lost by the black matrix BM, can be suppressed, the organic EL display device 1 higher in the light use efficiency can be realized.

As described above, in the organic EL display device 1 according to the embodiment of the present invention, the external light reflection can be reduced by the second electrode 500 which is a component of the additional capacitor 50. That is, the organic EL display device 1 that suppresses the external light reflection without the addition of a circularly polarizing plate, or a new layer can be realized. For that reason, the organic EL display device 1 that is thinner and lower in the costs can be realized.

When a reduction in the external light reflection is attempted with the above mechanism, because the light emitted from the light emitting layer, which travels toward the second electrode 500 side is also attenuated, there is a risk that the brightness is lowered. For that reason, it is desirable that the light having the wavelength band of 540 nm to 570 nm is set to be smaller than the light having the wavelength band of 455 nm to 490 nm in the reflectance of the pixel PX to the external light input from the first electrode 700 side. More desirably, the reflectance of the pixel PX to the light having the wavelength band of 430 nm to 730 nm input from the first electrode 700 side is minimum in the light included in the wavelength band of 540 nm to 570 nm. This is because the light emitting efficiency of blue is generally low in the organic light emitting diode element. Also, this is because in the organic light emitting diode of the white light emission, if the chromaticity of white is adjusted to, for example, (0.31, 0.33) in a CIE standard colorimetric system, the intensity of a wavelength corresponding to red may be insufficient. For that reason, with the above configuration, since the attenuation of light corresponding to blue, and also the attenuation of light corresponding to red can be suppressed, a reduction in the brightness of display, and an increase in the power consumption can be suppressed. On the other hand, in the reflection of the external light, because the reflection of light having the wavelength high in relative luminosity can be sufficiently reduced, a luminous reflectance can be reduced. That is, since the external light reflection can be reduced while suppressing a reduction in the light emission intensity of blue and red which are relatively low in the light emission efficiency in the organic light emitting diodes 60, the organic EL display device 1 brighter in display, or lower in the power consumption can be realized.

Figure 6:
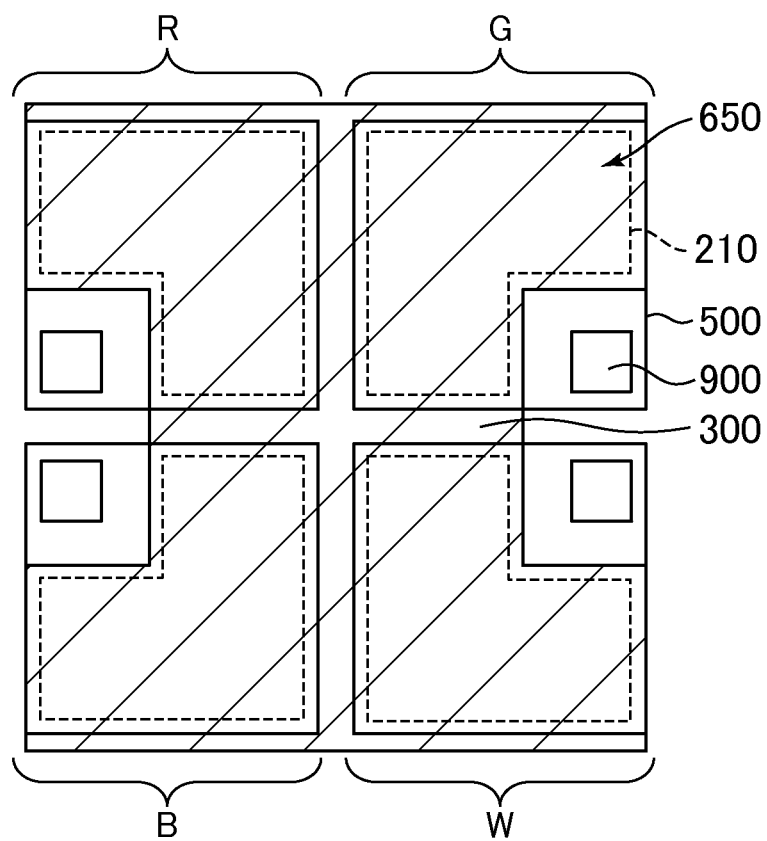
FIG. 6 is a perspective view of the pixel in the organic EL display device according to the first embodiment of the present invention.

FIG. 6 is a perspective view of the pixel PX in the organic EL display device 1 according to the first embodiment of the present invention. In FIG. 6, the respective pixels (R, G, B, W) are viewed in a plan view from the observer 1000 side illustrated in FIG. 4, that is, the display surface side of the organic EL display device 1, and a state in which the second electrodes 500 indicated by solid lines, edges of the pixel separation films 210 indicated by dotted lines, and the third electrodes 300 indicated by hatching overlap with each other is illustrated. An inside of the dotted line indicative of the edge of each pixel separation film 210 is the light emitting area 650. Each first through-hole 900 connects the second electrode 500 to the source electrode 27 of the driver transistors 20. In this example, the additional capacitor 50 configured by the second electrode 500, the insulating layer 400 not shown, and the third electrode 300 does not need to be separated for each of the pixels, unlike the storage capacitor 40. For that reason, the third electrode 300 is formed across the four adjacent sub-pixels, and the integrated electrode is formed by the adjacent pixels. In this case, because all of the portions between the four adjacent sub-pixels are covered with the third electrode 300, an area of the light emitting area 650 can be more widened while reducing the external light reflection. For that reason, the organic EL display device 1 that is brighter (or lower in the power consumption) can be realized.

Because the pixel separation film 210 and the third electrode 300 are formed in different layers, there is a need to provide a margin taking the position displacements of the position of the edge of the pixel separation film 210, and the position of the edge of the third electrode 300 into account, normally taking the respective position displacements at the time of manufacturing into account. In this example, in order to reduce the external light reflection, the opening of the pixel separation film 210 needs to be smaller than the second electrode 500. Therefore, if the second electrodes 500 are to be formed separately for each of the sub-pixels, the opening of the pixel separation film 210 is forced to be narrowed to some degree for the position displacement margin. However, if the second electrode 500 is formed across the adjacent pixels as in this embodiment, there is no need to take the position displacement of the pixel separation film 210 and the second electrode 500 into account, and the opening of the pixel separation film 210 can be widened.

Figure 7A:
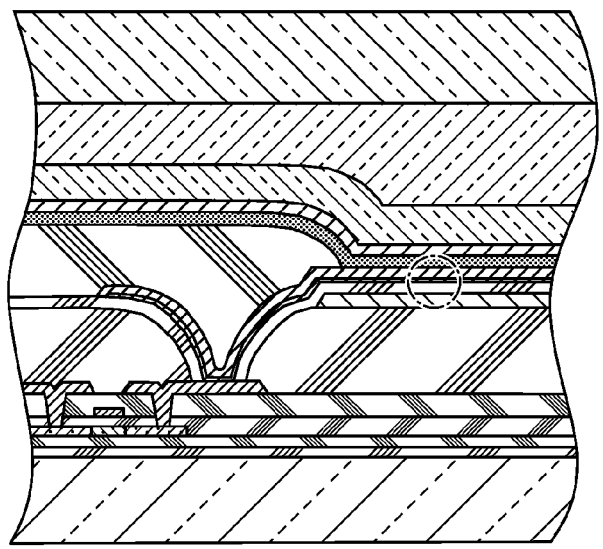
FIG. 7A is a diagram illustrating an enlarged portion of the cross-section of the pixel in the organic EL display device according to the first embodiment of the present invention.

FIG. 7A is a diagram illustrating an enlarged area of the cross-section of the pixel in the organic EL display device 1 according to the first embodiment of the present invention.

Figure 7B:
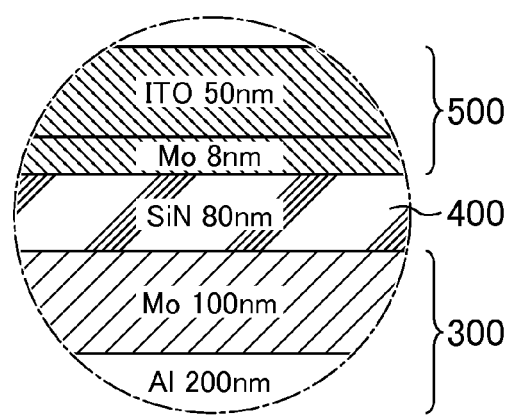
FIG. 7B is an enlarged view illustrating an enlarged area of the cross-section of the pixel in the organic EL display device according to the first embodiment of the present invention.

The enlarged area is an area surrounded by a circle of a dashed line. FIG. 7B is an enlarged view illustrating the enlarged area of the cross-section of the pixel in the organic EL display device 1 according to the first embodiment of the present invention. As illustrated in FIG. 7B, the second electrode 500 includes an Mo layer made of a metal material, and an ITO layer made of a conductive material higher in the transmittance of the visible light than the Mo layer. The insulating layer 400 is formed of an SiN layer thicker than the second electrode 500 and thinner than the third electrode 300. Also, the third electrode 300 is formed by laminating two kinds of metals such as Al and Mo.

In this embodiment, it is desirable that the second electrode 500 is formed by laminating ITO 45 nm to 55 nm in thickness on Mo 7 nm to 9 nm in thickness, the insulating layer 400 is made of SiN 72 nm to 88 nm in thickness, and the third electrode 300 is formed by laminating Mo 90 nm to 110 nm in thickness on Al 180 nm to 220 nm in thickness. FIG. 7B illustrates, as a preferable example for reducing the external light reflection, the second electrode 500 formed by laminating ITO 50 nm in thickness on Mo 8 nm in thickness, the insulating layer 400 made of SiN 80 nm in thickness, and the third electrode 300 formed by laminating Mo 100 nm in thickness on Al 200 nm in thickness.

Second Embodiment

Figure 8A:
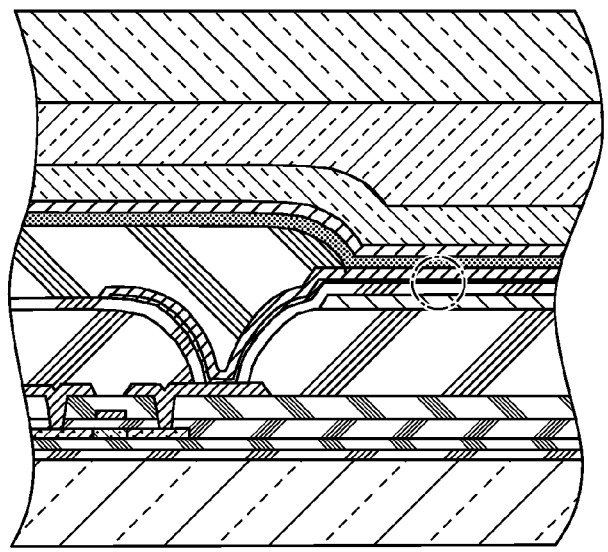
FIG. 8A is a diagram illustrating an enlarged portion of a cross-section of a pixel in an organic EL display device according to a second embodiment of the present invention.
Figure 8B:
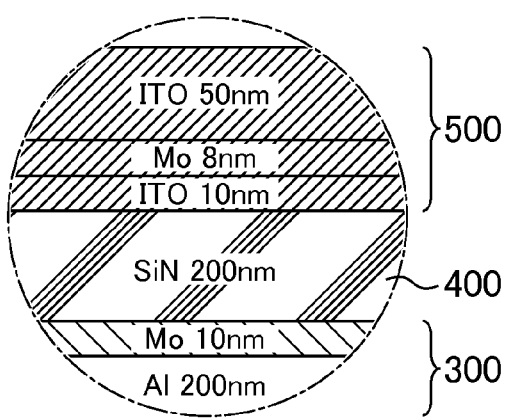
FIG. 8B is an enlarged view illustrating an enlarged area of the cross-section of the pixel in the organic EL display device according to the second embodiment of the present invention.

FIG. 8A is a diagram illustrating an enlarged portion of a cross-section of a pixel in an organic EL display device 1 according to a second embodiment of the present invention. The enlarged area is an area surrounded by a circle of a dashed line. FIG. 8B is an enlarged view illustrating the enlarged area of the cross-section of the pixel in the organic EL display device 1 according to the second embodiment of the present invention. The second electrode 500 according to this embodiment includes an Mo layer made of a metal material, and an ITO layer made of a conductive material higher in the transmittance of the visible light than the Mo layer. The insulating layer 400 is formed of an SiN layer thicker than the second electrode 500 and thinner than the third electrode 300. Also, the third electrode 300 is formed by laminating two kinds of metals such as Al and Mo. The second electrode 500 according to this embodiment is configured to sandwich Mo between ITO, and different in the structure from the second electrode 500 of the first embodiment.

In the second embodiment, it is desirable that the second electrode 500 is formed by laminating Mo 7 nm to 9 nm in thickness and ITO 45 nm to 55 nm in thickness on ITO 9 nm to 11 nm in thickness, the insulating layer 400 is made of SiN 180 nm to 220 nm in thickness, and the third electrode 300 is formed by laminating Mo 9 nm to 11 nm in thickness on Al 180 nm to 220 nm in thickness. FIG. 8B illustrates, as a preferable example for reducing the external light reflection, the second electrode 500 formed by laminating Mo 8 nm in thickness and ITO 50 nm in thickness on ITO 10 nm in thickness, the insulating layer 400 made of SiN 200 nm in thickness, and the third electrode 300 formed by laminating Mo 10 nm in thickness on Al 200 nm in thickness.

Figure 9:
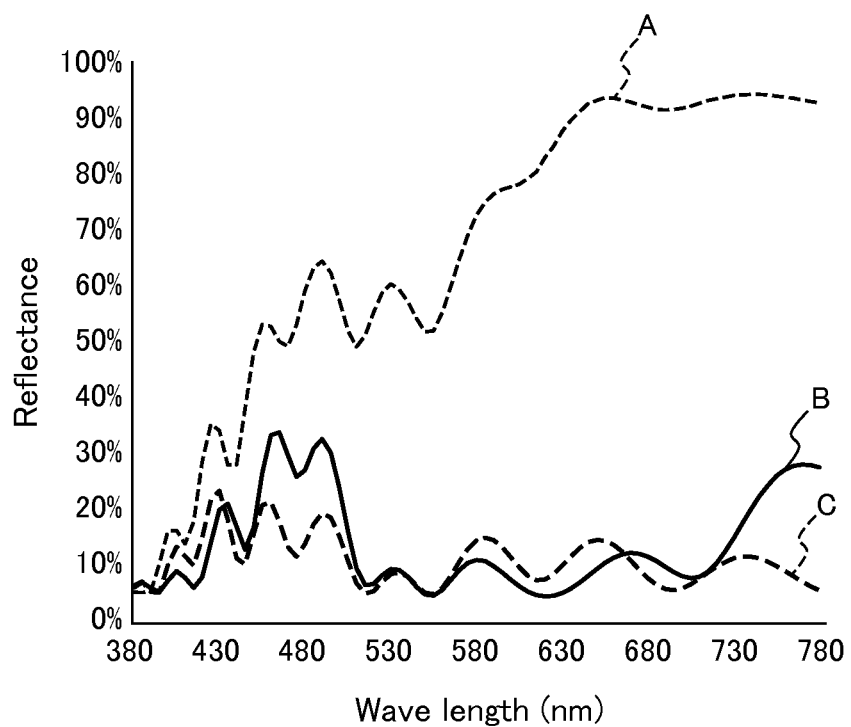
FIG. 9 is a diagram illustrating a relationship between a reflectance of a pixel and a wavelength in the first and second embodiments of the present invention, and a comparative example.

FIG. 9 is a diagram illustrating a relationship between the reflectance of the pixel and the wavelength in the first and second embodiments of the present invention, and a comparative example. In this example, the pixel shows only an area that is a light emitting area when viewed in a plan view from the observer side. In the graph, a line A shows a case of the comparative example, a line B shows a case of the first embodiment, and a line C shows a case of the second embodiment. In this example, the line B shows the result in the case of the configuration illustrated in FIG. 7B, and the line C shows the result in the case of the configuration illustrated in FIG. 8B. The comparative example is a case in which an electrode made of Ag and 120 nm in thickness is used as the second electrode 500, which is a case having no configuration corresponding to the third electrode 300. That is, the comparative example is configured such that the second electrode 500 that absorbs a part of the visible light, but reflects most of the visible light.

In the first and second embodiments of the present invention, the reflectance of the pixel is reduced in the area wide in the visible wavelength range as compared with the comparative example. In particular, the light having the wavelength band of 540 nm to 570 nm is smaller in the reflectance than the light having the wavelength band of 455 nm to 490 nm. Also, the reflectance to the light having the wavelength band of 430 nm to 730 nm is minimum in the light included in the wavelength band of 540 nm to 570 nm. For that reason, the luminous reflectance of the light emitting area 650 is 65% in the comparative example whereas the luminous reflectance is 9.6% in the first embodiment, and 9.9% in the second embodiment, which are remarkably reduced.

Figure 10:
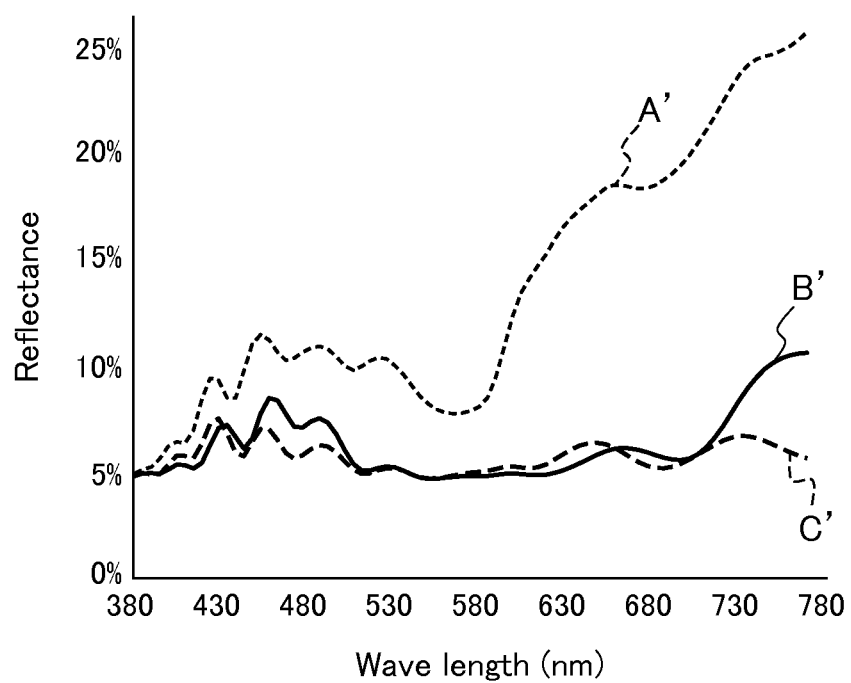
FIG. 10 is a diagram illustrating a relationship between a reflectance and a wavelength of the organic EL display device in the first and second embodiments of the present invention, and the comparative example.

FIG. 10 is a diagram illustrating a relationship between the reflectance and the wavelength of the organic EL display device 1 in the first and second embodiments of the present invention, and the comparative example. In the graph, a line A' shows a case of the organic EL display device with the configuration of the comparative example, a line B' shows a case of the organic EL display device 1 with the configuration of the first embodiment, and a line C' shows a case of the organic EL display device 1 with the configuration of the second embodiment. FIG. 9 illustrates the reflectance of only the pixel portion, but FIG. 10 illustrates the external light reflectance in the organic EL display device 1. For that reason, FIG. 10 also contributes to the attenuation of the reflected light by the black matrix BM and the color filter.

The external light reflectance in the organic EL display device 1 with the configuration of the first and second embodiments of the present invention is low in a wide area of the visible wavelength range as compared with the organic EL display device having the configuration of the comparative example. As a result, the luminous reflectance of the organic EL display device with the configuration of the comparative example is 10% whereas the luminous reflectance of the organic EL display device 1 with each configuration of the first and second embodiments is reduced to 5%. This numeric value is a low value close to that when the circularly polarizing plate is arranged on the display surface side in the configuration of the comparative example. Therefore, according to the present invention, the effect of reducing the external light reflection comparable to that when the circularly polarizing plate is used is obtained without the use of the circularly polarizing plate.

FIG. 11 is a table showing a difference of brightness between cases of the first and second embodiments of the present invention, and a case in which the circularly polarizing plate is arranged. As described above, according to the present invention, the effect of reducing the external light reflection substantially comparable to that when the circularly polarizing plate is used is obtained without the use of the circularly polarizing plate. If the circularly polarizing plate is used, because the light from the light emitting layer is also reduced, there is disadvantage in that the brightness is lowered. In view of this, the present invention performs both of the external light reflection reduction and the brightness maintenance. FIG. 11 illustrates an improvement rate of each color brightness in the first and second embodiments on the basis of a case of arranging the circularly polarizing plate in the comparative example. In a white pixel (W), a green pixel (G), and a red pixel (R), the improvement rate of brightness is several %. On the other hand, the improvement of brightness in the blue pixel (B) is 85% in the first embodiment, and 58% in the second embodiment, which are remarkably improved. As illustrated in FIG. 9, in the first and second embodiments, the reflectance in the wavelength range corresponding to blue of the wavelength 455 nm to 490 nm is comparable to or higher than the reflectance in the wavelength range of 490 nm to 730 nm. For that reason, the attenuation of light generated by the light emitting layer is low in blue, and the high brightness improvement rate can be realized particularly in blue. Because the organic light emitting diode element is generally low in the light emitting efficiency of blue, the above characteristic of the present invention compensates the drawback of the organic light emitting diode element.

Third Embodiment

Figure 12:
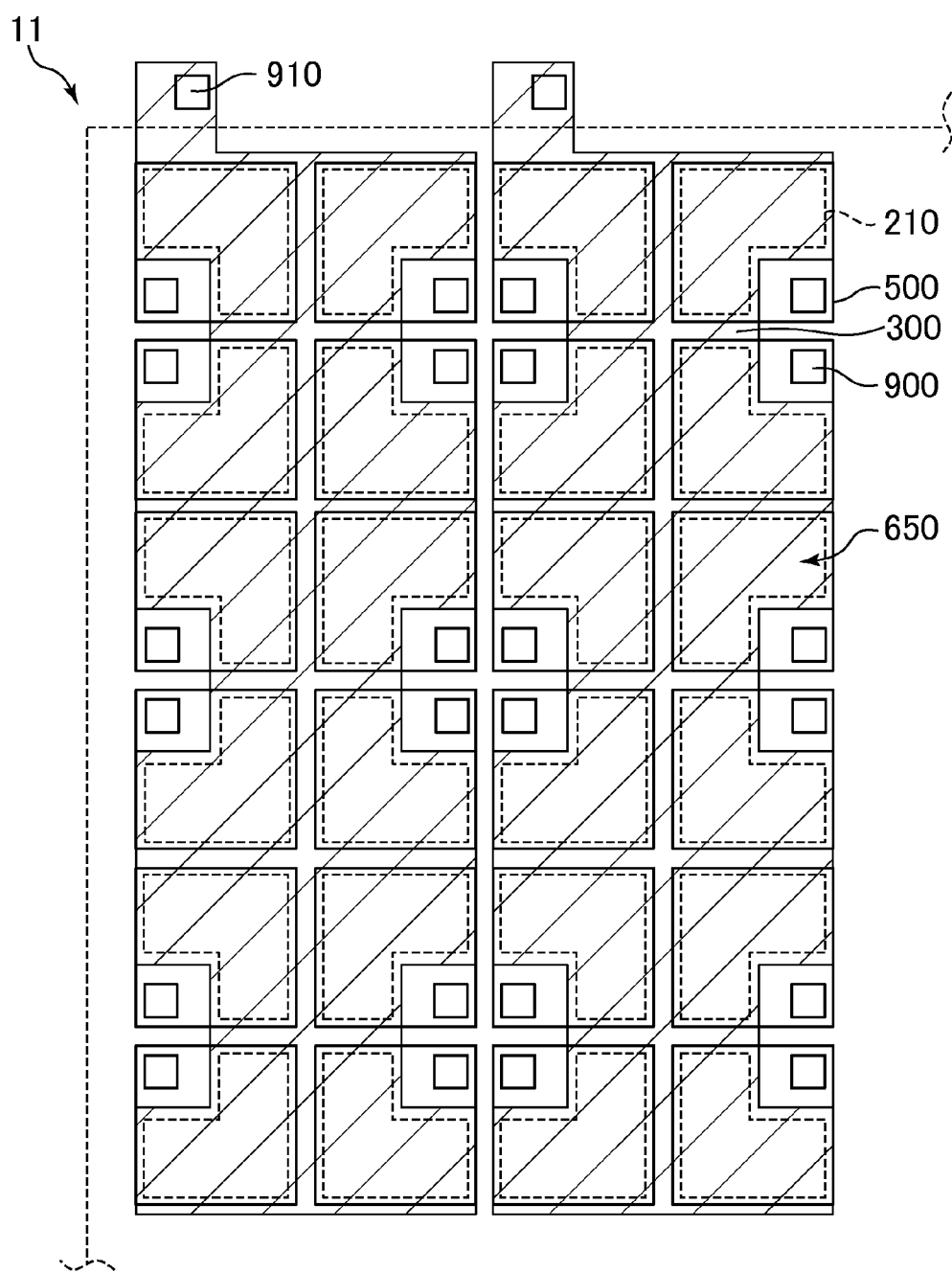
FIG. 12 is a perspective view of a pixel in an organic EL display device according to a third embodiment of the present invention.

FIG. 12 is a perspective view of the pixel in the organic EL display device 1 according to a third embodiment of the present invention. In this embodiment, the third electrode 300 is formed across the adjacent sub-pixels, and formed across not only pixels of only one unit of RGBW, but also pixels of plural units in strips. In this example, the third electrode 300 may be formed across a part of the pixels formed in the display area 11, or may be formed across all of the pixels. Also, the third electrode 300 extends outside of the display area 11, and is electrically connected to the first electrode 700 not shown through each second through-hole 910. With the application of this configuration, the additional capacitor 50 is formed between the overall surface of the third electrode 300 largely extended between the respective pixels, and the second electrode 500 formed in each of the pixels.

As in this embodiment, the third electrode 300 is formed across the plural pixels in strips whereby the edge of the pixel separation film 210 can be more widely formed not only in one unit of RGBW, but also in the plural pixels, as a result of which the area of the light emitting area 650 can be more widened. For that reason, the organic EL display device 1 that is brighter (or lower in the power consumption) can be realized.

If it is assumed that the third electrode 300 is used as a component of the storage capacitors 40, because the storage capacitors 40 must be separated for each of the pixels, the third electrode 300 must be separated for each of the pixels. In that case, because there is a need to provide a margin for positioning the third electrode 300, there is a need to narrow the opening of the pixel separation film 210. On the other hand, according to the present invention, when the third electrode 300 is a component of the additional capacitor 50, the third electrode can be formed across the plural pixels, and the opening of the pixel separation film 210 can be widened. For that reason, the present invention can perform both of the effect of the stable operation of the organic light emitting diodes 60 by the additional capacitor 50, and the effect of the brightness improvement caused by widening the light emitting area 650 at the same time.

As the embodiments of the present invention, all of the organic EL display devices that can be appropriately changed in design and implemented based on the organic EL display device 1 described above by those skilled in the art fall within the scope of the present invention without departing from the spirit of the present invention.

Within the spirit of the invention, those skilled in the art could conceive various changes and modifications, and those changes and modifications fall within the scope of the present invention. For example, those skilled in the art can suitably modify each of the above embodiments by addition, deletion, or design change of components, or by addition, omission, or condition change of processes, and such modifications are also encompassed within the scope of the invention as long as they fall within the spirit of the invention.

Also, the other effects provided by the above embodiments which are apparent from the present specification, or could be appropriately conceivable by those skilled in the art are understood to be naturally provided by the present invention.

While there have been described what are at present considered to be certain embodiments of the invention, it will be understood that various modifications may be made thereto, and it is intended that the appended claim cover all such modifications as fall within the true spirit and scope of the invention.

What is claimed is:
1. A display device, comprising:
a substrate;
a plurality of pixels that is arranged in a display area, and includes an organic layer having at least a light emission layer, and a light emitting area;
a first electrode that is formed on an opposite side of the organic layer to the substrate, and transmits a visible light;
a second electrode that holds the organic layer in cooperation with the first electrode, and is lower in the transmittance of the visible light, and higher in the reflectance than the first electrode;
an insulating layer that holds the second electrode in cooperation with the organic layer, and higher in the transmittance of the visible light, and lower in the reflectance than the second electrode; and
a third electrode that holds the insulating layer in cooperation with the second electrode, is formed across adjacent pixels of the plurality of pixels, and lower in the transmittance of the visible light, and higher in the reflectance than the second electrode,
wherein the light emitting area is an area in which the organic layer comes in direct contact with the first electrode and the second electrode, and
the third electrode is formed by stacking molybdenum 90 nm to 110 nm in thickness on aluminum 180 nm to 220 nm in thickness.
2. The display device according to claim 1, wherein the third electrode is formed to be larger than the light emitting area when the light emitting area is viewed in a plan view from the first electrode side.
3. The display device according to claim 2, comprising:
a TFT; and
a second insulating layer that is arranged between the TFT and the third electrode, wherein the insulating layer directly contacts with the TFT.
4. The display device according to claim 1, wherein the third electrode is electrically connected to the first electrode.

5. The display device according to claim 4, wherein the third electrode is formed to extend from the display area to an outside of the display area, and electrically connected to the first electrode outside of the display area.

6. The display device according to claim 1, wherein a light having a wavelength band of 540 nm to 570 nm is smaller than a light having a wavelength band of 455 nm to 490 nm in a reflectance of the light input from the first electrode side in the light emitting area.

7. The display device according to claim 1, wherein a reflectance of a light having a wavelength band of 430 nm to 730 nm input from the first electrode side in the light emitting area is minimum in a light included in a wavelength band of 540 nm to 570 nm.

8. The display device according to claim 1, wherein the second electrode includes a layer made of a metal material, and a layer made of a conductive material higher in the transmittance of the visible light than the metal material, and the insulating layer is formed to be thicker than the second electrode, and thinner than the third electrode.

9. The display device according to claim 1, wherein the second electrode includes a metal 5 nm to 30 nm in thickness.

10. The display device according to claim 1, wherein the second electrode includes at least one of the group consisting of magnesium, aluminum, titanium, chromium, iron, copper, molybdenum, tungsten, silver, and gold.

11. The display device according to claim 1, wherein the second electrode is formed by stacking indium tin oxide on molybdenum, the insulating layer is made of silicon nitride.

12. The display device according to claim 11, wherein the second electrode is formed by stacking indium tin oxide 45 nm to 55 nm in thickness on molybdenum 7 nm to 9 nm in thickness, and the insulating layer is made of silicon nitride 72 nm to 88 nm in thickness.

13. The display device according to claim 11, wherein the second electrode further includes indium tin oxide held between the insulating layer and molybdenum.

14. The display device according to claim 11, wherein the second electrode is formed by stacking indium tin oxide 45 nm to 55 nm in thickness on molybdenum 7 nm to 9 nm in thickness, and the insulating layer is made of silicon nitride 72 nm to 88 nm in thickness.

15. The display device according to claim 1, wherein the first electrode is formed across some of the plurality of pixels.

16. The display device according to claim 1, wherein the organic layer is formed across some of the plurality of pixels.

17. A display device, comprising:
a substrate;
a plurality of pixels that is arranged in a display area, and includes an organic layer having at least a light emission layer, and a light emitting area;
a TFT;
a first electrode that is formed on an opposite side of the organic layer to the substrate, and transmits a visible light;
a second electrode that holds the organic layer in cooperation with the first electrode, and is lower in the transmittance of the visible light, and higher in the reflectance than the first electrode;
an insulating layer that holds the second electrode in cooperation with the organic layer, and higher in the transmittance of the visible light, and lower in the reflectance than the second electrode;
a third electrode that holds the insulating layer in cooperation with the second electrode, is formed across adjacent pixels of the plurality of pixels, and lower in the transmittance of the visible light, and higher in the reflectance than the second electrode; and
a second insulating layer that is arranged between the TFT and the third electrode,
wherein a part of the second electrode directly contacts with the TFT,
wherein the insulating layer directly contacts with the TFT,
wherein the light emitting area is an area in which the organic layer comes in direct contact with the first electrode and the second electrode, and
wherein the third electrode is formed by stacking molybdenum 90 nm to 110 nm in thickness on aluminum 180 nm to 220 nm in thickness.

18. The display device according to claim 17, wherein the third electrode is formed to be larger than the light emitting area when the light emitting area is viewed in a plan view from the first electrode side.

* * * * *